(12) United States Patent
Chester et al.

(10) Patent No.: US 9,896,338 B1
(45) Date of Patent: Feb. 20, 2018

(54) SEGREGATED FLOW REACTOR AND METHOD FOR GROWTH OF ULTRA-LONG CARBON NANOTUBES

(71) Applicant: Mainstream Engineering Corporation, Rockledge, FL (US)

(72) Inventors: Gregory Chester, Orlando, FL (US); Justin J. Hill, Merritt Island, FL (US)

(73) Assignee: Mainstream Engineering Corporation, Rockledge, FL (US)

( * ) Notice: Subject to any disclaimer, the term of this patent is extended or adjusted under 35 U.S.C. 154(b) by 0 days.

(21) Appl. No.: 14/734,484

(22) Filed: Jun. 9, 2015

(51) Int. Cl.
*C07C 63/48* (2006.01)
*C01B 31/02* (2006.01)
*C23C 16/44* (2006.01)

(52) U.S. Cl.
CPC ......... *C01B 31/0226* (2013.01); *C23C 16/44* (2013.01)

(58) Field of Classification Search
None
See application file for complete search history.

(56) References Cited

U.S. PATENT DOCUMENTS

| | | | |
|---|---|---|---|
| 4,942,844 A | 7/1990 | Pinkhasov | |
| 2004/0232426 A1* | 11/2004 | Graham | B82Y 10/00 257/77 |
| 2005/0170089 A1* | 8/2005 | Lashmore | B82Y 10/00 427/248.1 |
| 2006/0073275 A1* | 4/2006 | Maruyama | B82Y 30/00 427/248.1 |
| 2007/0116634 A1* | 5/2007 | Ho | B82Y 30/00 423/447.3 |
| 2008/0206463 A1* | 8/2008 | Grigorian | B82Y 30/00 427/249.1 |
| 2010/0081568 A1* | 4/2010 | Bedworth | B01J 21/185 502/150 |
| 2010/0124530 A1* | 5/2010 | Lusk | B82Y 30/00 423/447.3 |

(Continued)

OTHER PUBLICATIONS

Open Archive TOULOUSE Archive Ouverte (OATAO) High specific surface area carbon nanotube from catalytic chemical vapor deposition process R.R. Basca a, Ch. Laurent a,), A Peigney a. W. S. Basca b, Th. Vaugien a, 2000, Chemical Physics Letters, vol. 323, n5-6, p. 566-571.

(Continued)

*Primary Examiner* — Joseph Miller, Jr.

(57) ABSTRACT

A reactor and method for seeded growth of nano-products such as carbon nanotubes, wires and filaments in which selected precursors are introduced into the reactor which is heated to a temperature sufficient to induce nano-product formation from interaction between the precursor gases and a nanopore templated catalyst. The selected precursors are segregated in the reactor through a plate defining two chambers which are sealed off from each other except for a void space provided in the plate. The void space is closed off by a membrane having nanopores and a catalyst formed as a layer. Atomic transfer of material from the selected precursors to form the nano-products on the catalyst layer in the other of the chambers occurs by diffusion through the catalyst layer to form the nano-product on the other of the chambers absent a pressure drop between the two chambers.

13 Claims, 7 Drawing Sheets

(56) References Cited

U.S. PATENT DOCUMENTS

2010/0212727 A1* 8/2010 Lee .................. B01J 6/00
                                                136/252
2012/0171106 A1* 7/2012 Barker ............... B82Y 30/00
                                                423/447.3

OTHER PUBLICATIONS

Nature Publishing Group—vol. 363—Jun. 17, 1993; Cobalt-catalysed growth of carbon nanotubes with single-atomic-layer walls D.S. Bethune, C.H. Klang*, M.S. de Vries, G. Gorman, R Savoy, J. Vazquez & R. Beyers IBM Research Division, Almaden Research Center, 650 Harry Road, San Jose, California 95120-6099, USA, Bethune, Nature, vol. 363, Jun. 1993, p. 605-607.
Nature Publishing Group—vol. 363—Jun. 17, 1993; Single-shell carbon nanotubes of 1-nm diameter by Sumo Iijime & Toshinari Ichihashi Fundamental Research Laboratories, NEC Corporation, 34 Miyukigaoka, Tsukub, Ibaraki 305, Japan, p. 603-605.
Ballistic carbon nanotube fieid-effect transistors Ali Jevey, Jing Gun, Qian Wang, Mark Lundstrom2 & Hongjie Dai Department of Chemistry, Stanford University, California 94305, USA, Nature, vol. 424, Aug. 2003, p. 654-657.

* cited by examiner

SEGREGATED FLOW REACTOR AND METHOD FOR GROWTH OF ULTRA-LONG CARBON NANOTUBES

STATEMENT REGARDING FEDERALLY SPONSORED RESEARCH OR DEVELOPMENT

This invention was made with Government support under contracts N00014-12-C-0536 and N000014-14-P-1139 awarded by the Office of Naval Research. The Government has certain rights in the invention.

BACKGROUND AND SUMMARY OF THE INVENTION

The present invention is an improved apparatus and method for continuous fabrication of single- and multi-wall carbon nanotubes (CNT) as well as other micro- and nano-wires, tubes or filaments by chemical vapor deposition, vapor-liquid-solid, or other similar seeded growth mechanisms as known by one of ordinary skill in the art. Particularly, the present invention is concerned with an apparatus for a segregated chemical vapor deposition (CVD) process where a carbon based gas is decomposed at high temperature in the presence of catalyst whereby a CNT is formed on the catalyst surface.

The first images of nanoscale, tubular carbon filaments were produced in the early 1950's by Russian scientists Radushkevich and Lykyanovich. The tremendous potential impact of carbon nanotubes (CNTs) was not felt until the work of Iijima et. al. [1: Iijima and Ichihashi; *Single-shell carbon nanotubes of 1-nm diameter*. Nature, 1993, (363), 603-605.] and Bethune et. al. [2: Bethune, Klang, De Vries, Gorman, Savoy, Vazquez and Beyers; *Cobalt-catalysed growth of carbon naontubes with single-atomic-layer walls*. Nature, 1993, (363), 605-607.] in 1993. Due to the projected impressive electronic and thermal transfer characteristics, CNTs have been of great interest in the electronics community for their potential to improve the functionality of electronic devices. [3: Javey, Guo, Wang, Lundstrom and Dai; *Ballistic carbon nanotube field-effect transistors*. Nature, 2003, (424), 654-657.]

The CVD process is often used as a synthesis method for high purity CNTs because of the controllability over precursor flow rate, composition, impurities and temperature. In the CVD process, a hydrocarbon gas such as, but not limited to, ethylene or acetylene is flowed into a reactor with hydrogen gas and a carrier such as, but not limited to, argon. The reactor is heated to a fixed set-point over the decomposition temperature of the selected hydrocarbon gas, at which point the gases decompose and reform into CNTs when in the presence of a catalyst or structure directing matrix. The exact formation mechanism of the CNTs is still of wide debate, and, as discussed later, the our novel apparatus may further aid in understanding of this mechanism although such an understanding is not a prerequisite to implementing the present invention. The ability to grow dense, ordered CNTs is directly related to the ability to evenly distribute the catalyst nanoparticles (NPs) on a substrate. Traditional nanoparticle synthesis methods include sol-gel formation, co-reduction of precursors, thermal decomposition, and physical deposition. These methods can produce large quantities of catalyst NPs, [4: Bacsa, Laurent, Peigney, Bacsa, Vaugien and Rousset; *High specific surface area carbon nanotubes from catalytic chemical vapor deposition process*. Chemical Physics Letters, 2000, (323), 566-571.], but it can be difficult to obtain the dense, highly ordered arrays of CNTs that are desired for the production of microelectronic devices. The standard method for carpeted growth of CNTs by CVD is to form a thin (~1 nm) catalyst film, which is difficult to produce over large substrate areas, on a substrate that is designed to interact in a phobic manner with the catalyst upon melting such that molten NPs are formed and CNTs growth from them.

Template-directed growth of catalyst nanostructures and CNTs in anodized aluminum oxide (AAO) porous films can produce dense and highly ordered CNT arrays. To form a templated CNT array, pure aluminum is first anodized in a chilled acid bath via a potentiostatic anodization process. The parameters of the anodization process are tunable to produce AAO pores with diameters of 10-100's nm, lengths up to 3 mm, and pore densities approaching $10^{12}$ cm$^{-1}$. AAO can be formed atop native aluminum or other conductive supports. The growth of CNTs in AAO nanopores is typically performed via a catalyzed CVD process with transition metal catalysts such as cobalt, nickel or iron.

Template assisted CNT growth is commonly performed with catalytic nanoparticles of iron-group elements (Fe, Co, or Ni) or alloys of these with Mo or Pd. Significant attention has been paid to studying the relationship between these catalysts and the CNT structure, quality, and dimensions. To synthesize CNTs in the AAO template, the anodized alumina barrier layer at the pore base was removed so as to expose the conductive aluminum surface for catalyst nanoparticle electrochemical deposition (ECD). After ECD, the template was subjected to CVD at the same conditions described previously. Growth continuing beyond the surface of the template is, however, rapidly disordered and quenched due to catalyst aggregation, poisoning and build-up of carbonaceous material on the surface.

When fashioning devices such as wires and composites from CNTs, ultimate length is the driving factor behind many of the device properties. Traditional growth methods previously described have limited CNT length which, in turn, inhibits the material's potential properties due to the large number of CNT-CNT interfaces acting to increase resistance. By extending the length of the CNT beyond the micron scale up to the centimeter or meter length, the material properties of CNT based wires and composites would near that of pure CNTs.

The many methods for CNT fabrication are limited in ultimate CNT length as CNT growth is stunted by a number of naturally occurring processes. The catalyst material can be poisoned through contaminants in the gas stream or can become encapsulated in carbon residue from the degradation of the hydrocarbon gas stream. Alternately, the CNTs can become entangled among themselves causing catalyst merging and/or premature termination.

U.S. Pat. No. 7,431,965 discloses an apparatus for continuous production of single wall CNTs (SWCNTs) using a metallic catalyst supported on an AAO nanoporous membrane, with pores open on both sides, where the membrane is used to separate the inner tube of a concentric tube reactor and a pressure differential between the tubes is the driving force to the direction of CNT growth. The disclosed mechanism of CNT formation does not, however, appear to take into account the immense capillary pressure ($P_c$) in a nanopore which is ~$10^7$ Pa according to the equation $$P_c = \frac{2\gamma\cos\theta}{r}$$

where γ is the surface tension of the catalyst, θ is the catalyst contact angle, and r is the nanopore diameter. At these pressures, the vacuum pulled on the inner tube 14 does little to influence CNT formation in that direction. Also, the disclosed apparatus does not allow for varying gas flow conditions in that inner tube in order to study the formation and doping mechanisms of CNTs. That apparatus uses a non-ideal flow pattern which provides inconsistent gas flow to the catalyst layer 30.

The present invention is an apparatus for a chemical vapor deposition process for the formation of carbon nanotubes by catalytic decomposition of carbonaceous precursors in the presence of hydrogen at high temperatures. The CNTs are formed through an AAO porous membrane with a thin, solid catalyst layer on one side used to segregate the carbonaceous gases from a clean stream in order to prevent premature termination due to solid carbon accumulation, catalyst poisoning and other termination mechanisms. Since the flow is segregated and variable, the role of hydrogen during CNT growth into the "clean" stream can be studied and elucidate the formation mechanism for CNT CVD growth. Indeed, this apparatus can be beneficially used to enact any kind of catalyst-seeded growth with segregated flow of identical or similar compositions.

An object of our invention is to provide a single heated chamber segregated into two chambers along its length by a plate which may be fixed or removeable. Importantly, the plate has a void such that the porous membrane may be affixed to it in order to provide a single point where gas can diffuse between the chambers through the AAO supported catalyst film. The gas composition of each chamber can be varied to consider various formation and doping mechanisms in CNTs or other nanostructure growth mechanisms. As a result, no pressure drop is required to drive CNT growth into the second chamber as the capillary pressure induced from the interfacial interaction of the molten catalyst and the nanoporous template will be tuned by chemically and/or structurally to accomplish this.

A further object of our invention is to control the catalyst architecture within the nanopores of the template. A thin film of catalyst is deposited on one side of the porous membrane such that gases must diffuse through the catalyst to move between the segregated chambers. The catalyst material forms a meniscus about the nanopores where the shape of the meniscus is related to the interfacial energies between the catalyst and the porous membrane. Controlling this interfacial energy will determine whether the meniscus forms within the pore or at the pore opening and will determine the shape of the meniscus depending on if the porous membrane is phillic or phobic to the catalyst material. The interfacial energy can be tuned by altering the temperature, pore size, or membrane surface chemistry among other techniques known to the art. The catalyst film atop the nanoporous template may be placed in the reactant or clean side of the plate segregating the chamber. The catalyst may also be applied to the porous membrane in other forms such as, e.g., a pore wall coating.

The present invention is a substantial improvement over the known CVD processes for growth of CNTs in such a way to induce ultra-long CNT growth while examining the CNT growth mechanism and doping mechanism in various carbon free gases. Other objects, advantages and novel features of the present invention will become apparent from the following detailed description when considered in conjunction with the accompanying drawings herein.

DETAILED DESCRIPTION OF THE DRAWINGS

Figure 1:
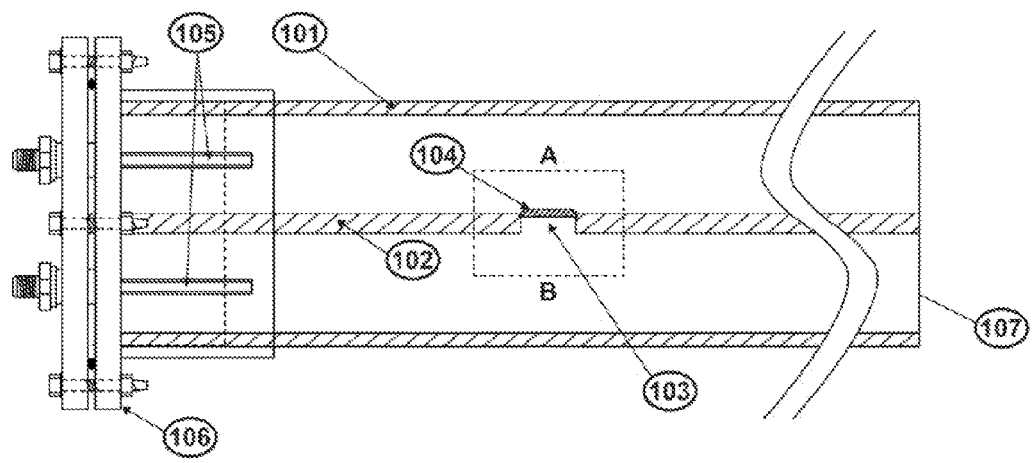
FIG. 1 is a schematic assembly view of a cylindrical embodiment of the multi-chambered apparatus of the present invention shown in partial cross-section.

Now referring to FIG. 1, the disclosed apparatus is composed of a reactor tube 101 which is composed of quartz but could also be composed of alumina, titania or another high temperature ceramic as known to the art for use in high temperature furnaces. In one embodiment as shown, the tube 101 is round but can also be configured as a polygon of any number of sides such that a segregating plate 102 may be affixed within tube 101 either permanently or removably such that the reactor is divided into two chambers A and B. The segregating plate 102 has a void space 103 between the chambers A, B. The void space 103 is closed off by a removable nanoporous membrane 104 with a catalyst film 203 (FIG. 2) across one surface such that material can only transition between the reactor chambers by diffusion through the catalyst layer 203. Gases enter the reactor chambers A,B through gas inlet tubes 105 which pass through a compression seal designated generally by the numeral 106 to prevent oxygen from entering the system though the system may be sealed in any manner known to the art such that the chambers A,B remain segregated. One chamber A or B of the reactor is fed a mixture of a hydrocarbon gas, water vapor, hydrogen, a carrier gas, and potentially other gases that benefit the growth process. The hydrocarbon may consist of ethylene, acetylene or another hydrocarbon; the carrier gas may be Ar, $N_2$ or another inert gas such that it is non-reactive with the other gases. Dopant gases may be fed to either chamber along with gases such as water vapor to restrict the formation of amorphous carbon or provide a benefit to continuous growth processes. The reactor is heated using a conventional resistive wire heating element (not shown for sake of clarity) although it can be heated by any other known method. The effluent end 107 of the tube 101 is connectable in a known way to a reducing coupling such that the gas exits through a ¼ inch stainless steel tube to induce an increase or decrease in pressure relative to the outside environment. The two chambers A, B may be separately vented or combined into a single vent where it may flow out through a treatment system or a vacuum.

Figure 2:
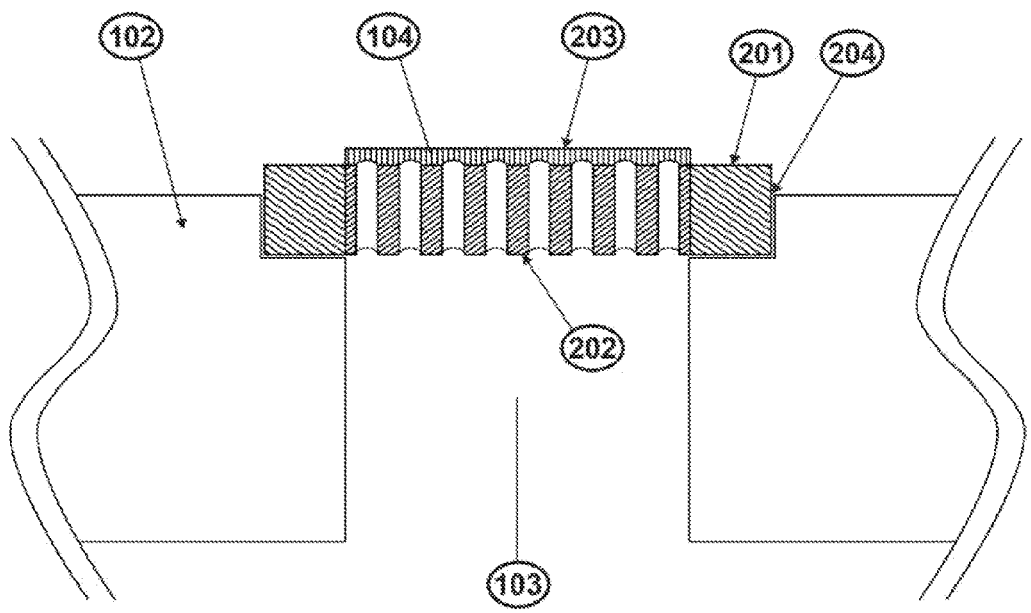
FIG. 2 is an enlarged cross-sectional view of the porous membrane affixed to the void in the segregating plate shown in FIG. 1 with catalyst applied to one end of the open porous membrane.

FIG. 2 is a cross-sectional isolated view of the segregation plate 102, void space 103, and porous membrane 104 from FIG. 1. The porous membrane consists of annular region of non-anodized aluminum or other nanoporous template (such as ceramic material) 201 with a center anodized region 202 although the anodized region may make up the entirety or just a portion of the membrane 104. A thin film catalyst 203 is applied to one surface of the membrane 104, but it may also be placed in either orientation such that atomic transfer between the reactor chambers A, B must occur due to diffusion through the catalyst 203 which consists of, for example, an iron-group element (Fe, Ni, Co), an alloy thereof, or one of the many other catalyst materials known in the art. The catalyst film 203 is applied to the surface either as a bulk film, through a physical deposition process such as sputtering or evaporation, a vapor deposition or another known type of method which forms a cohesive film across the nanoporous surface. The porous membrane 104 rests on a lip 204 such that gas flow cannot transfer around the membrane although the lip is unnecessary if the porous membrane 104 forms a cohesive seal without. The catalyst film 203 may also be applied by layer-by-layer, sol-gel, colloidal self-assembly or any other related deposition technique to form a film or coating on the surface or within the nanoporous template.

Figure 3A:
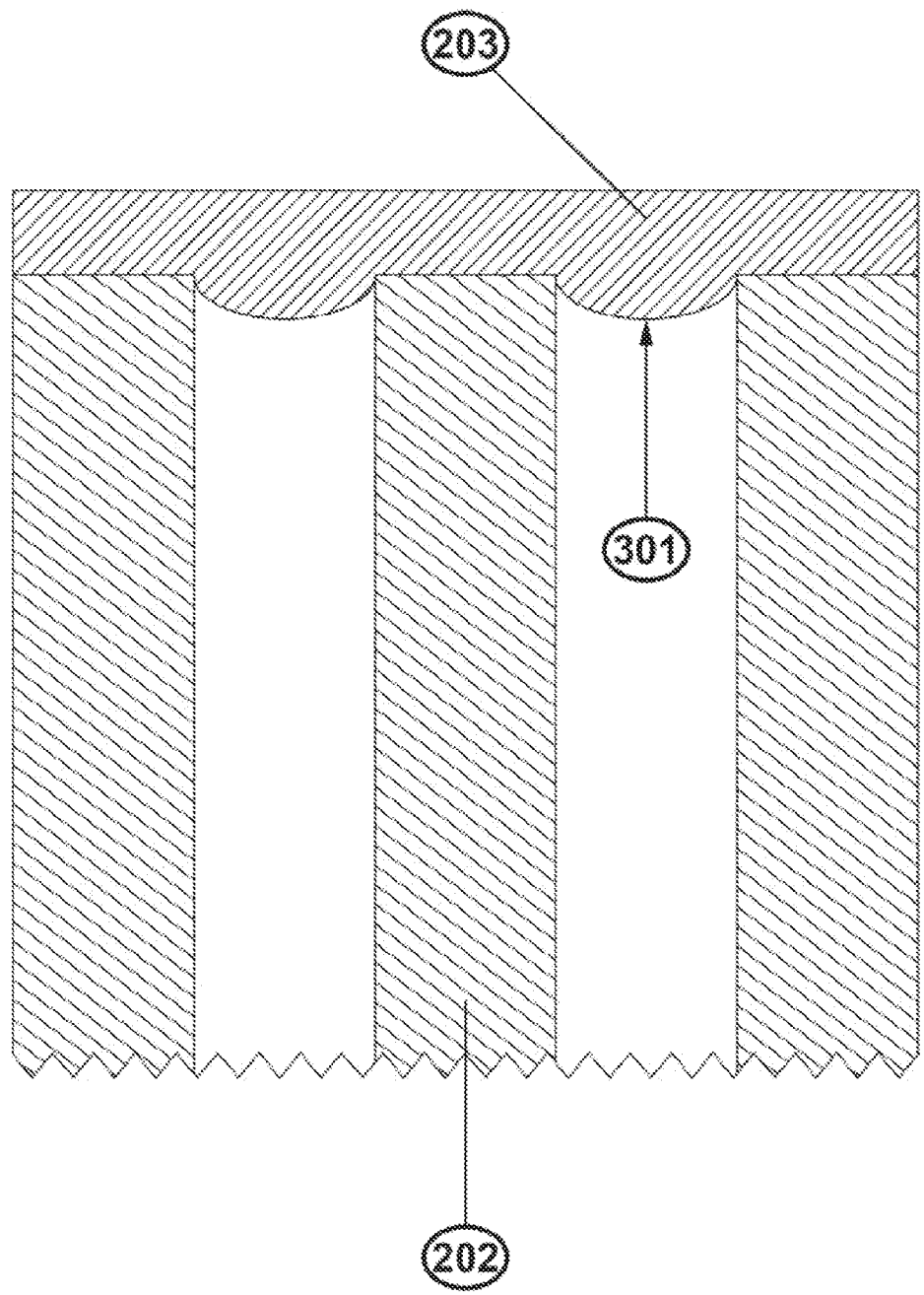
FIGS. 3A-D are further enlarged cross-sectional views of the porous membrane with affixed catalyst shown in FIG. 2 but with various catalyst meniscus alternatives due to altered membrane/catalyst interfacial energies.
Figure 3B:
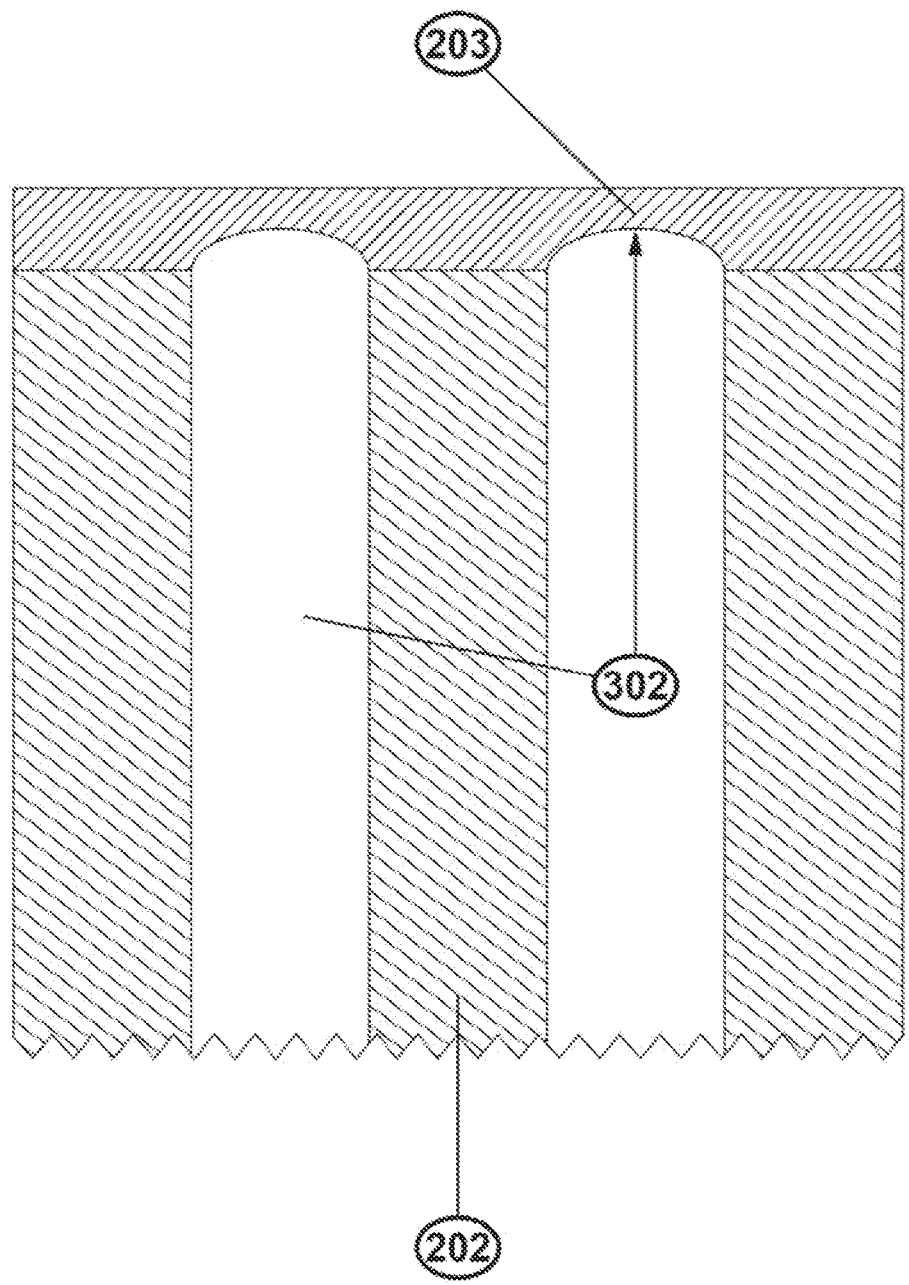
Figure 3C:
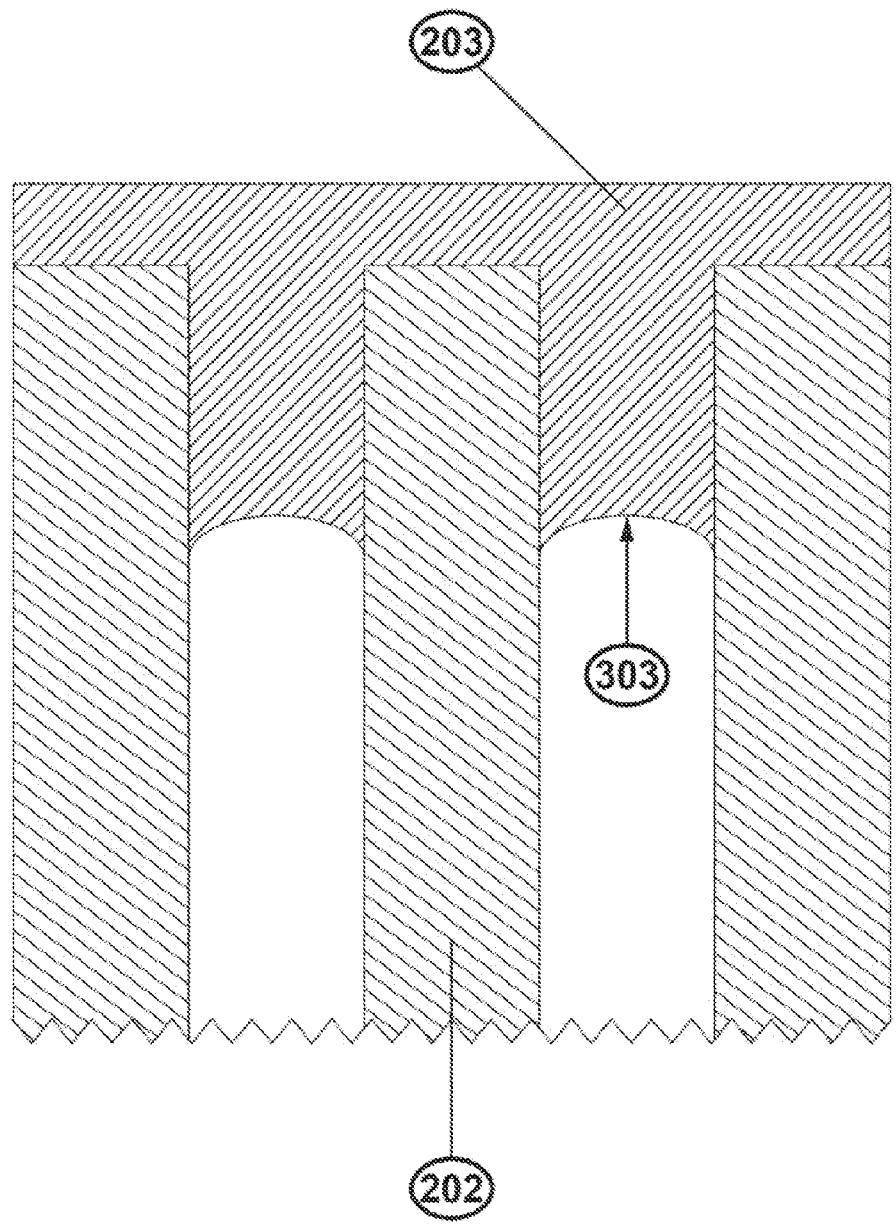

FIG. 3A, FIG. 3B, and FIG. 3C represent three contemplated catalyst-substrate interactions where the catalyst meniscus is dependent on the interfacial energies between the catalyst 203, porous membrane 201 and gas and the capillary pressure within each nanopore. The catalyst curvature is required to form CNTs but the ultimate interfacial energy will determine whether the CNT grows in a root or tip growth methodology. Root growth occurs when the catalyst material remains in place while the CNT grows from this point. Tip growth dislodges a particle of catalyst from the well and ceases growth upon ejection of all carbon. CNTs grown via tip growth from a catalyst well will be short and potentially be joined to other CNTs by catalyst particles continuously dislodging from the well at the base of the initial nanotube. This is due to the fact that the CNT precursor material must traverse the catalyst layer and if a catalyst particle dislodges from this layer it loses communication with the carbon source and growth ceases. If the CNT is formed via root growth, it continues growing as long as carbon is diffusing through the catalyst layer to the root of the CNT.

FIG. 3A represents a low catalyst-substrate interfacial energy with a positive or convex) (out from the catalyst film 203) capillary pressure driving the molten catalyst 301 into the pore. The low catalyst-substrate interfacial energy causes the molten catalyst to minimally wet the pore and upon formation of a CNT should demonstrate a tip-growth mechanism leading to a series of short interconnected CNTs.

FIG. 3B. is similar to FIG. 3A in that itrepresents the same low catalyst-substrate interfacial energy leading to a high catalyst contact angle, but in this case, a negative or concave (into the catalyst film 203) capillary pressure drives a negative meniscus within the catalyst film. CNT formation in this catalyst-substrate system will drive root growth due to the catalyst's preference to remain attached to the bulk film.

FIG. 3C shows a phillic substrate-catalyst interaction where the catalyst film 203 will wick into the pore due to massive positive capillary pressure forces similar to how water wicks in to a glass capillary. This wicking will induce the concave curvature 303 necessary for CNT formation and cause root growth due to the catalysts propensity to remain attached the pore wall and catalyst bulk.

Figure 3D:
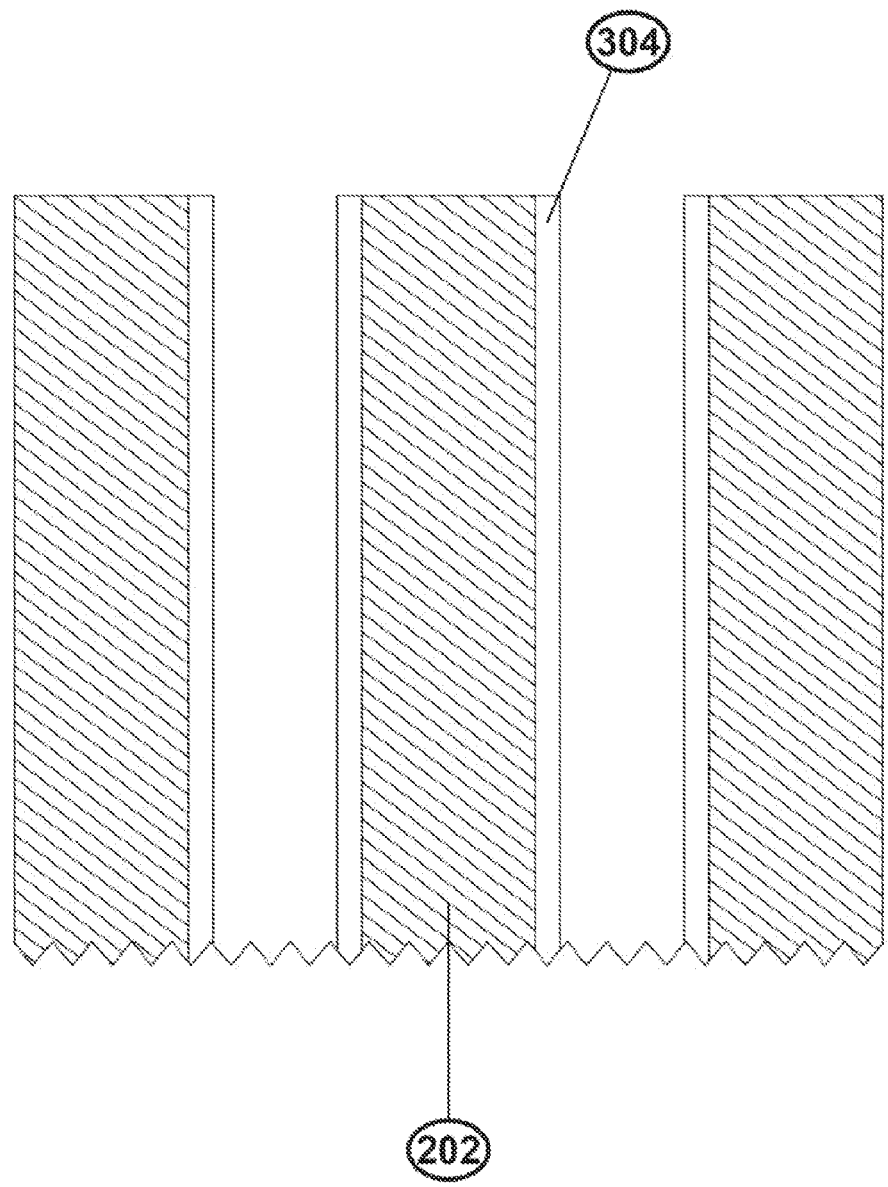

FIG. 3D shows an alternative catalyst application method whereby the catalyst 304 is coated along with walls of the nanoporous template 202. In this embodiment, the chambers A, B are not completely segregated; however, the immense aspect ratio provides enough catalyst surface area to catalyze the majority of the gas flowing through the nanocapillary. The catalyst material may applied through vapor deposition, atomic layer deposition, liquid phase self-assembly or other known material deposition processes without departing from the scope of our invention.

Figure 4:
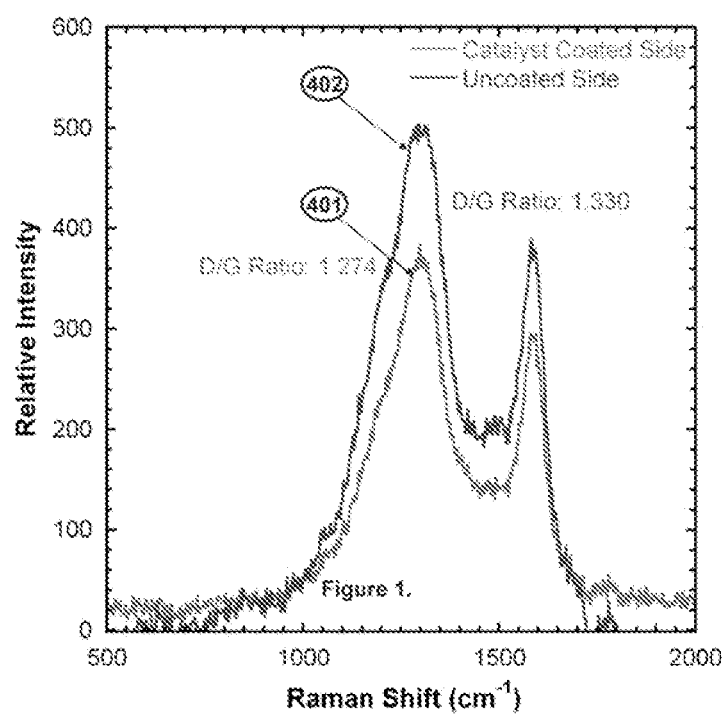
FIG. 4 is a Raman spectra indicating CNT growth on both sides of a template subject to CNT growth in the SFCVD reactor.

FIG. 4 is the Raman spectroscopy signals of the top (catalyst coated) 401 and bottom sides 402 of an AAO template coated with an iron catalyst and subjected to the growth conditions described herein with the template situated such that the catalyst bulk was in the reactant gas side FIG. 1, chamber A of the reactor. Two distinct peaks are represented in the Raman spectra at 1350 $cm^{-1}$ and 1580 $cm^{-1}$ which represent the disorder induced and graphitic peaks respectively in a carbon network. The presence of these distinct peaks indicates CNT growth on both the sides of the template.

While we have shown and described several embodiments in accordance with our invention, it should be understood that the same is susceptible to further changes and modifications without departing from the scope of our invention. Therefore, we do not want to be limited to the details shown and described herein but intend to cover all such changes and modifications as are encompassed by the scope of the appended claims.

We claim:

1. A reactor heatable to high temperatures for seeded growth of nano-products by flowing selected precursors therewithin, comprising a sealed-interior housing having a gas inlet at one end for introducing the selected precursors into the housing and a gas outlet at another end for exhausting the selected precursors, a plate arranged within the housing to define two chambers in the housing which are sealed off from each other except for a void space provided in the plate with the selected precursors from the gas inlet entering one of the chambers, and a membrane having nanopores and a catalyst layer selected and being arranged to close off the void space, with the nanopores being sized and the gas inlet and gas outlet being arranged so that the selected precursors are constrained to flow along only one surface of the membrane from the gas inlet to the gas outlet, wherein the membrane is positioned such that the gas flow is substantially parallel to the one surface of the membrane such that atomic transfer of material from the selected precursors to form the nano-products on the catalyst layer occurs only by diffusion through the catalyst layer on the one surface.

2. The reactor of claim 1, wherein the plate is removably arranged within the housing.

3. The reactor of claim 1, wherein the housing is configured as one of a hollow circular tube and a hollow polygon.

4. The reactor of claim 1, wherein the reactor is comprised of one of quartz and ceramic material.

5. The reactor of claim 1, wherein the gas inlet is configured to supply the selected precursors as a mixture of hydrocarbon gas, water vapor, hydrogen and an inert carrier gas to the one of the chambers.

6. The reactor of claim 1, wherein the nano-products comprise one of carbon nanotubes, nanowires and nanofilaments.

7. The reactor of claim 1, wherein the housing and chambers are configured to employ chemical vapor deposition for the seeded growth.

8. The reactor of claim 1, wherein the catalyst layer is selected and tuned to form a meniscus shape at the nanopores such that the meniscus shape influences nanostructure growth.

9. The reactor of claim 1, wherein the catalyst layer is selected and tuned to form a meniscus shape at the nanopores by selection of at least one of reactor temperature, size of the nanopores, surface composition of the membrane and catalyst material.

10. The reactor of claim 1, wherein the catalyst layer is within, and at least partially along walls of, the nanopores.

11. The reactor of claim 1, wherein the membrane is a ceramic material.

12. The reactor of claim 1, wherein the catalyst layer is selected to induce carbon nanotube growth.

13. A reactor heatable to high temperatures for seeded growth of nano-products by flowing selected precursors therewithin, comprising a sealed-interior housing having a gas inlet at one end and a gas outlet at another end, a plate arranged within the housing to define two chambers in the housing which are sealed off from each other except for a void space provided in the plate with the selected precursors from the gas inlet entering one of the chambers, and a membrane having nanopores and a catalyst layer selected and being arranged to close off the void space, with the nanopores being sized so that the selected precursors flow along only one surface of the membrane from the direction of the gas inlet to the gas outlet such that atomic transfer of material from the selected precursors to form the nano-products on the catalyst layer occurs only by diffusion through the catalyst layer on the one surface, wherein a selected dopant gas is introduced into the other of the two chambers.

* * * * *